(12) United States Patent
Belcher et al.

(10) Patent No.: US 8,535,506 B2
(45) Date of Patent: Sep. 17, 2013

(54) METHOD FOR SYNTHESIZING METAL OXIDE NANOCYRSTALS

(75) Inventors: Angela M. Belcher, Lexington, MA (US); Dong Soo Yun, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 347 days.

(21) Appl. No.: 12/594,253

(22) PCT Filed: Apr. 2, 2008

(86) PCT No.: PCT/US2008/059142
§ 371 (c)(1),
(2), (4) Date: Nov. 4, 2011

(87) PCT Pub. No.: WO2008/124440
PCT Pub. Date: Oct. 16, 2008

(65) Prior Publication Data
US 2012/0055795 A1    Mar. 8, 2012

Related U.S. Application Data

(60) Provisional application No. 60/910,323, filed on Apr. 5, 2007.

(51) Int. Cl.
C25D 9/04    (2006.01)

(52) U.S. Cl.
USPC ......................................................... 205/333

(58) Field of Classification Search
USPC ......................................................... 205/333
See application file for complete search history.

(56) References Cited

U.S. PATENT DOCUMENTS

2005/0221083 A1* 10/2005 Belcher et al. ................ 428/364
2006/0121346 A1   6/2006 Nam et al.
2006/0275955 A1  12/2006 Ku et al.
2007/0034142 A1   2/2007 Pescini et al.

OTHER PUBLICATIONS

Verbeek et al., Fe and Co Nanowires and Nanotubes Synthesized by Template Electrodeposition, J. Electrochem. Soc., 150 (10) E468-E471 (2003).*

* cited by examiner

Primary Examiner — Luan Van
Assistant Examiner — Ho-Sung Chung
(74) Attorney, Agent, or Firm — Steptoe & Johnson LLP (57) ABSTRACT

Method for synthesizing metal oxide nanocrystals. The method includes forming a precursor solution including the metal oxide cation and introducing a selected metal oxide binding virus into the solution. Electrical pulses are generated across the solution whereby highly crystalline nanowires are formed.

5 Claims, 12 Drawing Sheets

METHOD FOR SYNTHESIZING METAL OXIDE NANOCYRSTALS

CLAIM OF PRIORITY

This application claims priority under 35 USC 371 to International Application No. PCT/US2008/059142, filed on Apr. 2, 2008, which claims priority to U.S. Provisional Application Ser. No. 60/910,323, filed Apr. 5, 2007, each of which is incorporated by reference in its entirety.

FEDERALLY SPONSORED RESEARCH OR DEVELOPMENT

This invention was made with government support under Grant No. DAAD19-03-D-0004 awarded by the Army Research Office. The government has certain rights in this invention.

BACKGROUND OF THE INVENTION

This invention relates to the synthesis of nanocrystalline particles.

Nanocrystalline particles are of wide interest to researchers in various fields because of their properties as well as their many important technology applications. Such nanocrystalline materials show size-dependent characteristics and often possess unique electronic, magnetic, optical, chemical and mechanical properties that cannot be achieved by using their bulk counterparts. Some important nanocrystalline particles are electrochromic materials that change colors under the influence of an applied potential.

Devices using electrochromic materials have traditionally been limited to applications that do not require rapid color changes, such as windows that can be tinted at the flip of a switch. Fast electrochromic materials, such as those reported in this specification, could be a solution for low-cost, low-energy displays. High performance electrochromic devices require fast ionic diffusion, a uniform structure without local defects, and a significant charge modulated optical response (1-4). Numbers in parentheses refer to the references listed herein, the contents of all of which are incorporated herein by reference. Iridium dioxide ($IrO_2$) has shown promising results as an electrochromic material (5); metal oxides electrochromic materials exhibit superb stability of the metal oxides; and iridium oxide has the fastest response times and displays good color contrast (6). Films composed of nanocrystals or nanowires can form a porous structure, supplying numerous diffusion pathways, while maintaining a highly uniform structure at the atomic level. Biological systems can template the growth of nanostructured crystalline inorganic materials (7-10). Particularly, we have previously reported virus-enabled nanoarchitectures for advanced lithium ion batteries using cobalt oxide nanowires (11). The biological systems provide genetic control of the assembled material as well as enabling aqueous synthesis at ambient temperatures. While previous work has relied on chemical oxidizing or reducing agents in the synthesis of virus nanowires, in this specification a new approach, utilizing electrical pulses to oxidize precursors during biologically-directed nanowire assembly, is introduced.

SUMMARY OF THE INVENTION

The method according to the invention for synthesizing metal oxide nanocrystals includes forming a precursor solution including the metal oxide cation and introducing a selected metal oxide binding virus into the solution. Electrical pulses generate a potential across the solution so that highly crystalline nanowires are formed. It is preferred that the solution be an aqueous solution. A suitable metal oxide is iridium dioxide, $IrO_2$. It is also preferred that the pulses be exponentially decaying pulses having pulse voltages in the range of 400 volts to 1,000 volts.

DESCRIPTION OF THE PREFERRED EMBODIMENT

Figure 1:
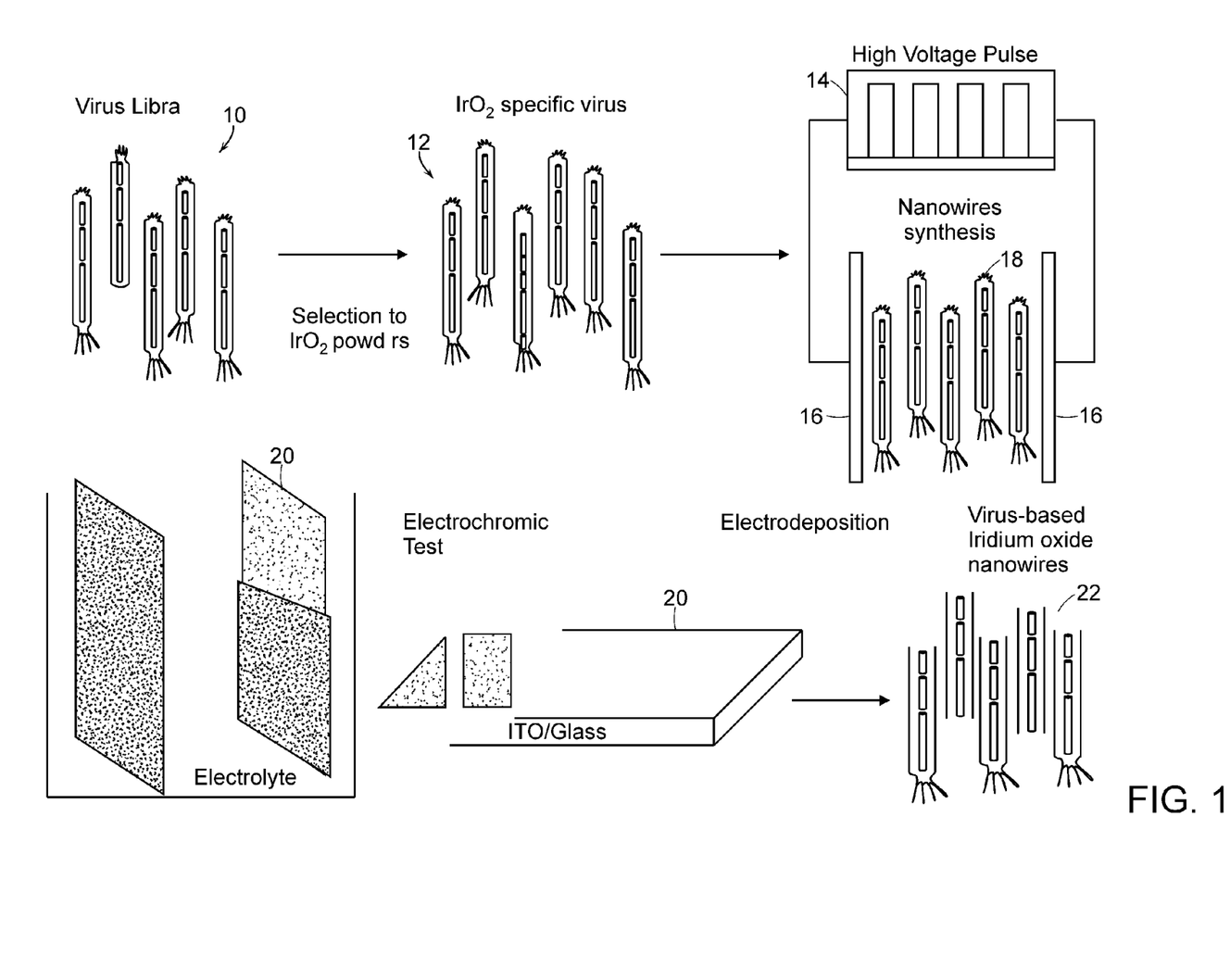
FIG. 1 is a schematic diagram of virus-templated synthesis and assembly of nanowires as anode materials for electrochromic devices according to an embodiment of the invention.

With reference first to FIG. 1, a phage display library 10 was used to select phage that displayed peptides with an affinity for $IrO_2$ as shown at 12. High voltage pulses 14 are applied to electrodes 16 to synthesize nanowires 18. The nanowires 18 were then deposited on patterned indium tin oxide (ITO) glass 20. Virus-based iridium oxide nanowires 22 were produced.

The M13 bacteriophage is a filamentous virus that is approximately 900 nm in length and 6.5 nm in diameter. The single-stranded viral DNA is encased by a cylindrical capsid composed of 2700 copies of the p8 major coat protein. Minor coat proteins (p3, p6, p7 and p9) are situated at either end of the virus. Through modification of the M13 genome, peptides sequences can be displayed on these different proteins. Through the modification of the coat proteins, the virus can template and grow nanostructured semiconductor and magnetic materials (12-14).

A type 8 phage display library was used to select phage that displayed peptides with an affinity for $IrO_2$. Unlike traditional plasmid techniques for modifying the p8, the type 8 library provides 100% expression of peptides on the N-terminus of each p8 protein (15). After three rounds of biopanning against $IrO_2$ powder (Sigma-Aldrich, 99.9%), two different dominant $IrO_2$ peptide binding motifs were identified: EQPANSLP and AGETQQAM. Previous phage-based nanowires have relied on chemical agents such as $NaBH_4$ to reduce precursors during wire assembly. $IrO_2$ films have been synthesized by a variety of different methods including pulsed laser deposition (16), sputtering (17), and sol-gel techniques (18). Each of these synthetic methods for polycrystalline $IrO_2$ films requires temperatures of at least 300° C. The synthesis of single crystalline $IrO_2$ typically requires processing at temperatures as high as 1000° C. over a period of four days (19). Utilizing a bench-top, solution-based technique simplifies the production process by eliminating the need for high temperature processing and expensive vacuum systems, while providing an environmentally benign route for assembly of electrochromic materials on flexible surfaces.

Figure 2A:
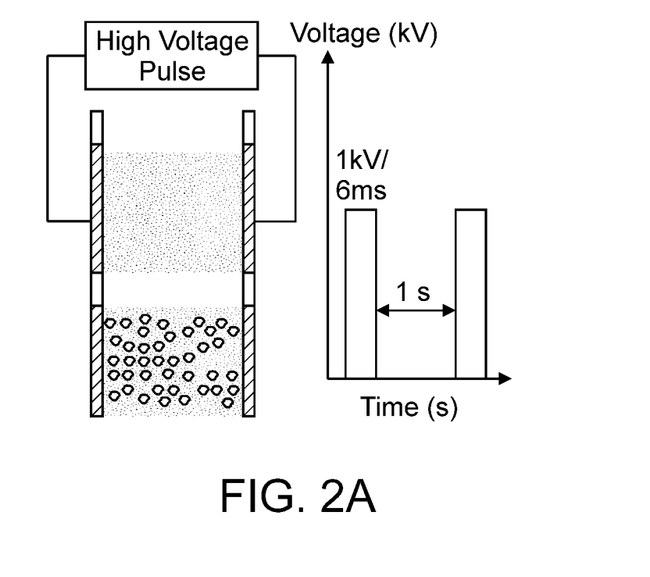
FIG. 2A is a schematic diagram of the electrical pulse system and the applied pulse profile.
Figure 2B:
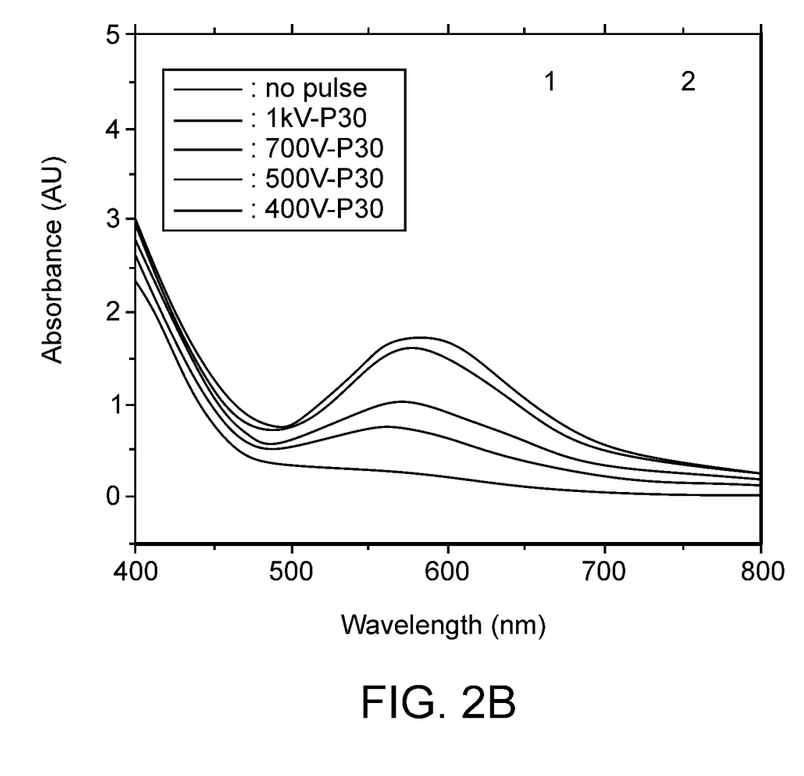
FIG. 2B is a graph showing absorbance spectra of resultant nanoparticles formed under a variety of pulse conditions. The inset shows images of solutions before and after thirty 1 kV pulses.
Figure 2C:
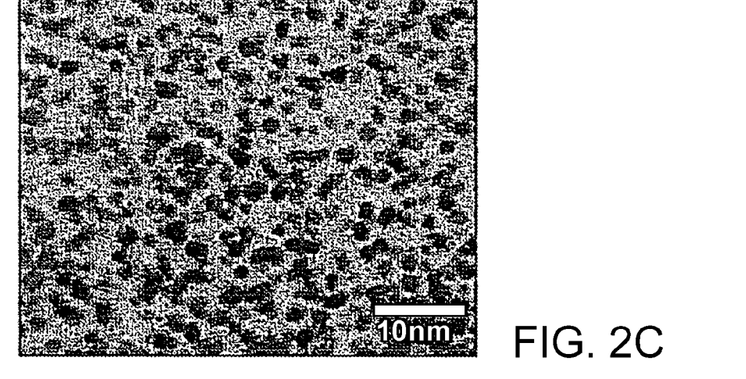
FIG. 2C is a transmission electron microscope image of uniform, 2-3 nm $IrO_2$ nanocrystals after 10 700 kV pulses.
Figure 2D:
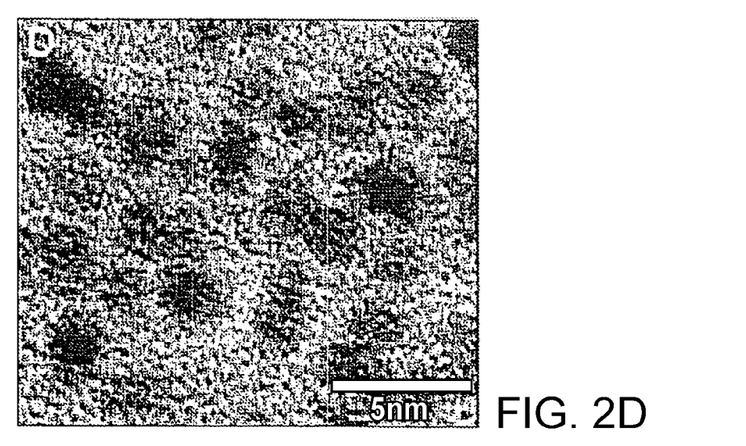
FIG. 2D is a corresponding high resolution TEM (HR-TEM) image exhibiting lattice fringes.
Figure 2E:
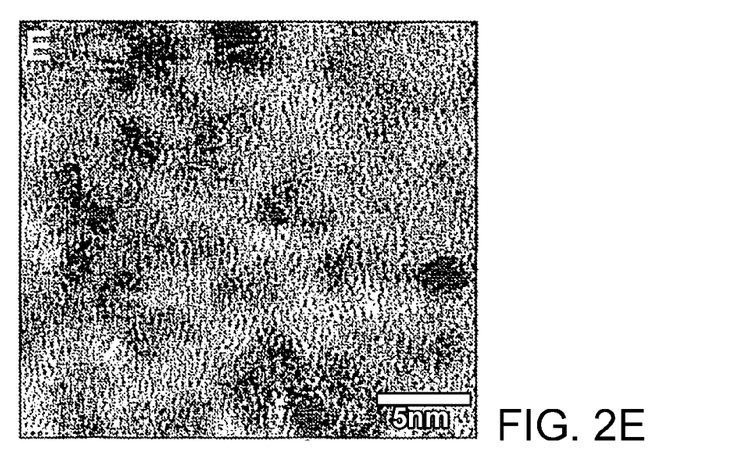
FIG. 2E is a TEM image of 5 nm $IrO_2$ nanocrystals after 30 1 kV pulses.
Figure 2F:
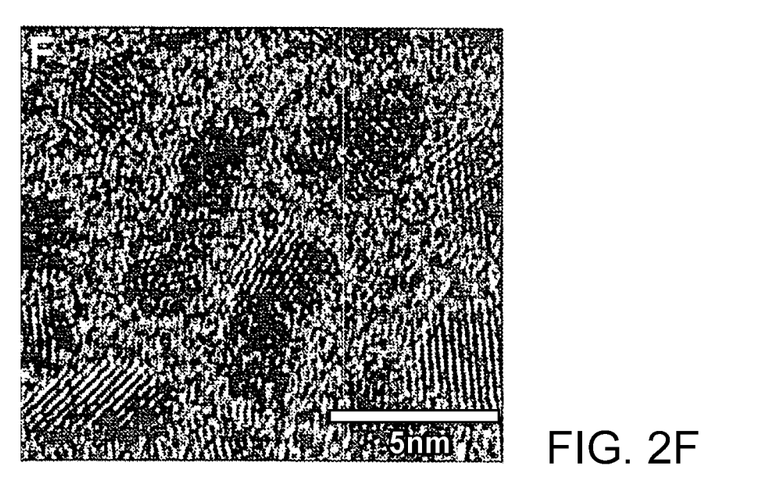
FIG. 2F is a corresponding HRTEM image exhibiting clear lattice spacing.

A BioRad GenePulser electroporator, a commonly used tool in the genetic engineering of cells, was used to supply high voltage, exponentially decaying electric pulses to aqueous $IrCl_3$ precursor (Alfa Asaer, 99%). 200 μL of 25 mM $IrCl_3$, adjusted to pH 7.5 with 1M NaOH is pulsed in an electroporation cuvette with a 2 mm gap. The electric field and injected charge acts to oxidize the $Ir^{3+}$ ions as well as to stimulate the nucleation of $IrO_2$ nanoparticles. Samples were pulsed 30 times at voltages ranging from 400V to 1,000V. Immediately upon the application of electric pulses, the solution changed color from brown to purple, with an absorbance peak appearing near 600 nm (FIG. 2A and 2B). The absorbance spectra indicated that the peak absorbance at 600 nm increased with increasing voltage, suggesting higher yield and larger particles. Particle size was confirmed by high resolution transmission electron microscopy (HRTEM). A drop of the nanocrystal suspension was placed on a carbon coated TEM grid, washed with water and dried in air. TEM images were obtained using a JEOL 2010 and 2010F. Dark field STEM images were performed with a probe size of 0.7 HR and a camera length of 8 cm. From the TEM micrograph, it was observed that the radius and size distribution of nanoparticles formed at 700V (10 pulses) was less than those at 1,000 V (30 pulses) (FIG. 2C and 2E). Elemental mapping by energy dispersive X-ray analysis (EDS) (not shown) of the samples pulsed at 1,000V confirmed the formation of highly crystalline $IrO_2$ (FIG. 2D and 2F).

Figure 3A:
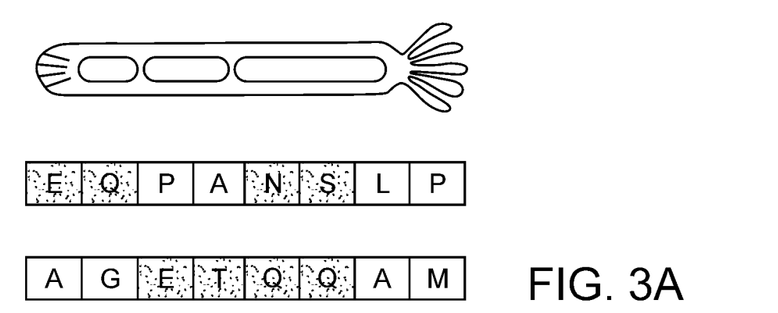
FIG. 3A is a schematic virus highlighting genetically engineered p8 proteins and specific $IrO_2$ binding p8 sequences used in nanowires assembly according to an embodiment of the invention.
Figure 3B:
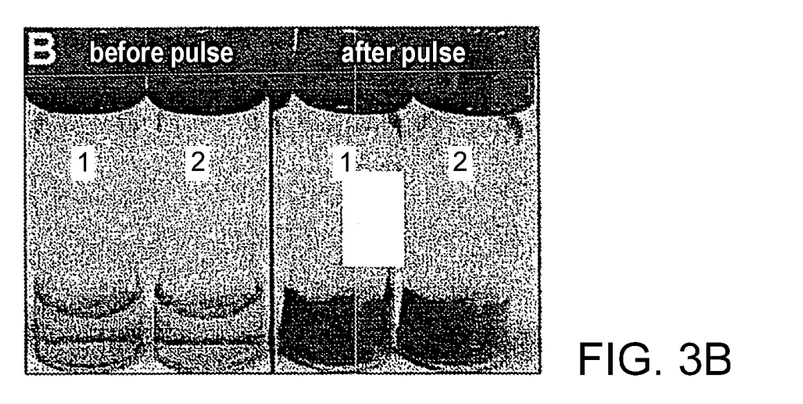
FIG. 3B are images of virus-nanowire solution compared before (two week incubation) and after pulses (30 1 kV) with sequences EQPANSLP and AGETQQAM.

To assemble these nanocrystals into wires, the two $IrO_2$ binding phage selected using the type 8 library (FIG. 3A) were combined with the $IrCl_3$ precursor prior to applying electric pulses. The phage were added at a concentration of $10^6$ pfu/μL to the 25 mM $IrCl_3$ solution. Irrespective of the peptide sequence, immediately upon pulsing, the color of the solutions turned purple, indicating the formation of $IrO_2$ (FIG. 3B). Phage incubated without the electric field pulses for nearly 6 months exhibited no color change, indicating the lack of oxidation of the $IrCl_3$ precursor.

Figure 3C:
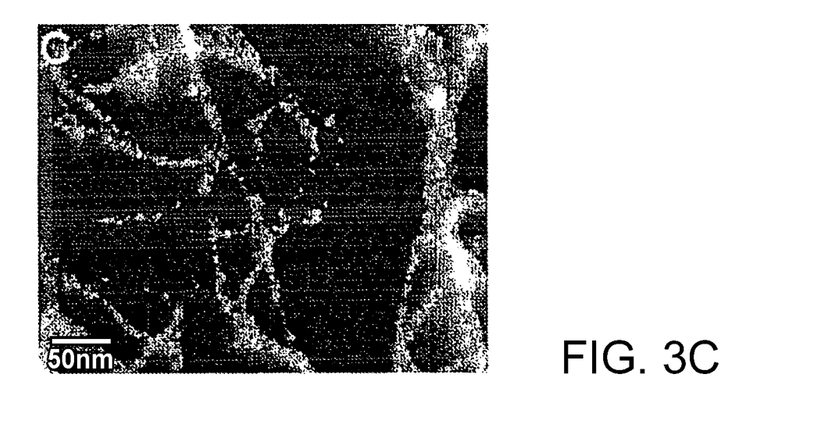
FIG. 3C is a dark field scanning TEM image of EQPANSLP-directed $IrO_2$ nanowires after 10 1 kV pulses.
Figure 3D:
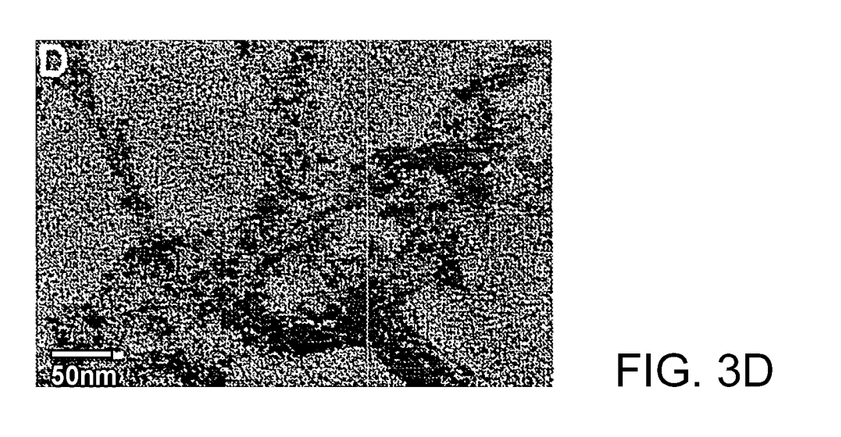
FIG. 3D is a corresponding high magnification TEM image.
Figure 3E:
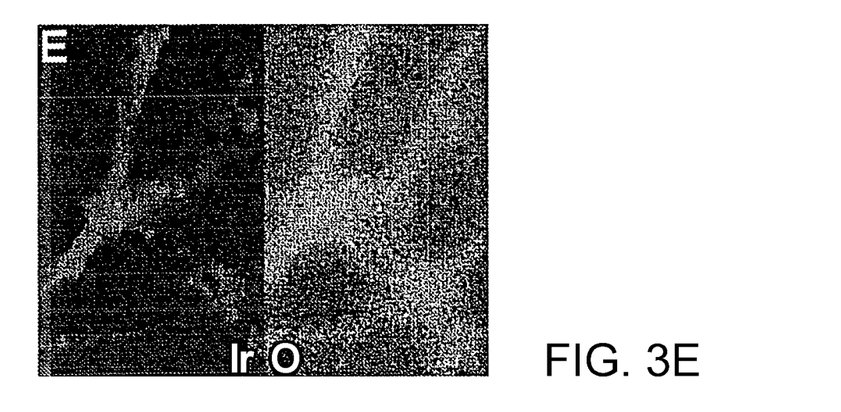
FIG. 3E are plasmon elemental maps taken in energy-filtered TEM mode recorded from AGETQQAM-directed $IrO_2$ nanowires after 10 1 kV pulses.
Figure 3F:
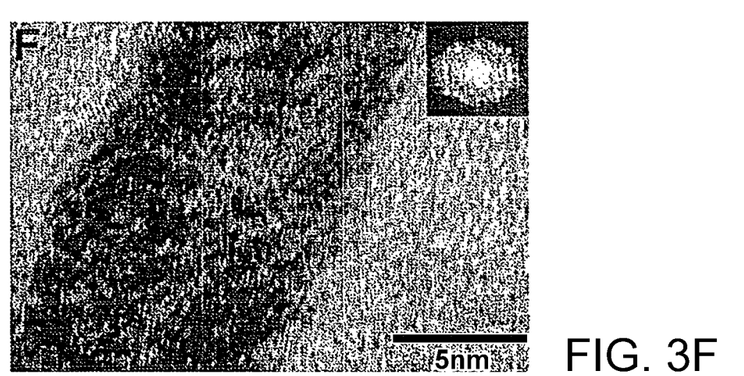
FIG. 3F is an HRTEM image of the AGETQQAM-directed $IrO_2$ nanowires after 30 1 kV pulses showing complete nanocrystal coverage of the virus surface and highly crystalline lattice structure.
Figure 5:
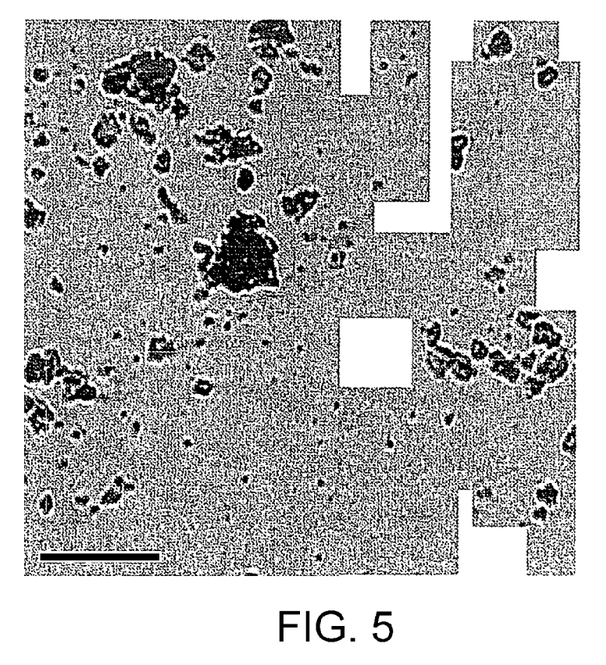
FIG. 5 is a TEM image showing nanowire properties of wild type virus incubated for four days after 30 1 kV pulses.
Figure 6A:
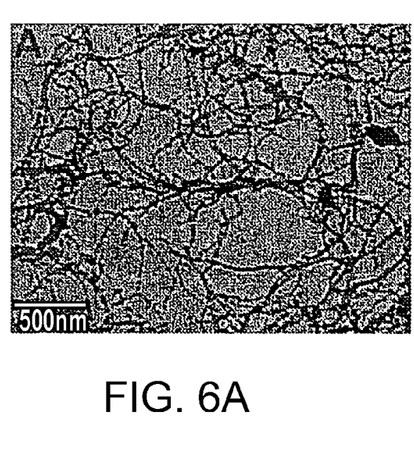
FIG. 6A is a TEM image of $IrO_2$ nanowires formed from the EQPANSLP selected virus after 10 1 kV pulses.
Figure 6B:
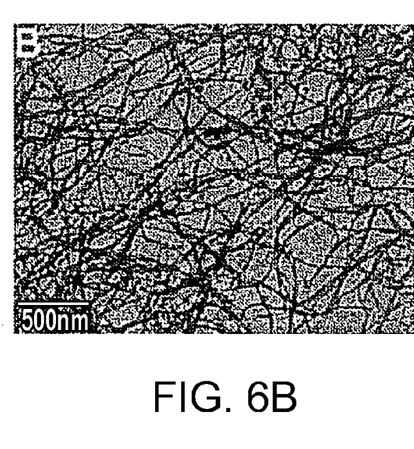
FIG. 6B is a TEM image of the AGETQQAM-directed $IrO_2$ nanowires after 10 1 kV pulses.

The displayed peptide sequence had a significant effect on the quality of nanowires produced. As a comparison, wild type sequences which lack the specific peptide insertion into p8 were not effective in nanowire synthesis (FIG. 5). After 10 pulses, both sequences exhibited a uniform distribution of $IrO_2$ nanocrystals along the viral length. However, there was not 100% coverage of the viral surface (FIGS. 3C, 3D and 6) as revealed by electron microscopy. Plasmon elemental mapping (FIG. 3E) and x-ray line scanning analysis (not shown) of AGETQQAM-derived nanowires confirmed $IrO_2$ formation. After 30 pulses, HRTEM image verified that viruses expressing the AGETQQAM sequence exhibited complete nanocrystal coverage, with the entire virus capsid uniformly coated with highly crystalline $IrO_2$ nanocrystals (FIG. 3F). These results indicate that the displayed peptide plays an important role in mediating the assembly of $IrO_2$ on the phage surface during the electrical pulse. Furthermore, the functionality of the M13 phage remains intact even under the high field conditions of this work.

To evaluate the electrochromic properties of the $IrO_2$ nanowires, the nanowires were filtered using Millipore 5 kDa Centricon-70 centrifugal filters with biomax membranes in order to remove unreacted precursors and then electrodeposited onto patterned indium tin oxide (ITO) electrodes. The ITO electrodes on glass were from Delta Technologies with sheet resistance of 5-15 ohms. We prepared 2.5 cm×7.5 cm×1.1 cm ITO glasses and patterned chemically in aqua regia solution using silicone tape (3M as an etching barrier). ITO were sonicated in ethanol and distilled water and vacuum dried. Electrodeposition was carried out at positive 17-18V using platinum counter electrodes. Resulting films had a blue color, indicating successful deposition of $IrO_2$. An electrochemical cell was constructed, with the $IrO_2$ nanowire film serving as the working electrode, a Pt counter electrode, and Ag/AgCl reference electrode in 0.1 M $HClO_4$ electrolyte solution. Cyclic voltammetry measurements were made using AUTOLAB/PGSTAT302, at room temperature with potentials between −0.2V and +1.2 V, and with a voltage sweep rate of 20 mV/s in 0.1M $HClO_4$ electrolyte.

Figure 4A:
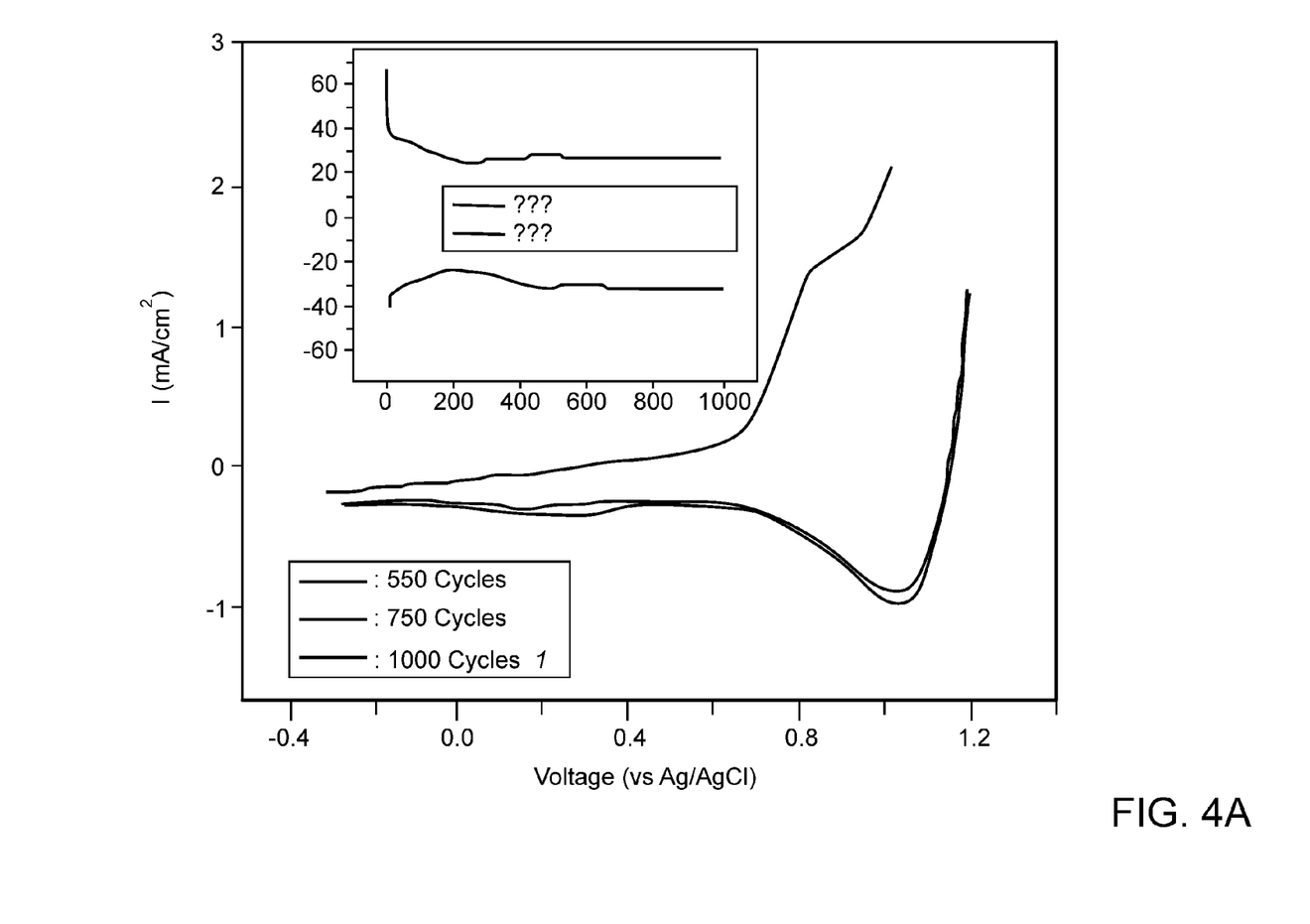
FIG. 4A shows cyclic voltammograms of AGETQQAM-directed $IrO_2$ nanowires. The inset shows variation in charge densities for both oxidation and reduction.

The virus-based $IrO_2$ nanowires films exhibited both anodic and cathodic polarization (FIG. 4A). Under anodic polarization, blue or blue-black color intensity increased with increasing anodic potential. For cathodic polarization, color bleaching was observed due to $Ir^{4+}$ to $Ir^{3+}$ intervalence charge transfer during the potential scan. Moreover, the virus-templated $IrO_2$ nanowires films were shown to be stable under strong acidic conditions with little loss in exchanged charge density after up to $1\times10^3$ cycles. Ideally, the charge density during coloring and bleaching should remain constant over many cycles. The charge ratios extracted from the cyclic voltammograms indicate that the system attains ideal reversible behavior after 200 cycles (FIG. 4A, inset). This result implies that some microstructural changes occur during initial cycling that result in the irreversible accumulation of charges, potentially the build up of protons along the virus surface or the creation of IrOH ternary compounds. Upon extending cycling, the sites responsible for irreversible charge accumulation become saturated and the nanowires films permit fluid insertion and extraction of ions, leading to ideal reversibility.

Figure 7:
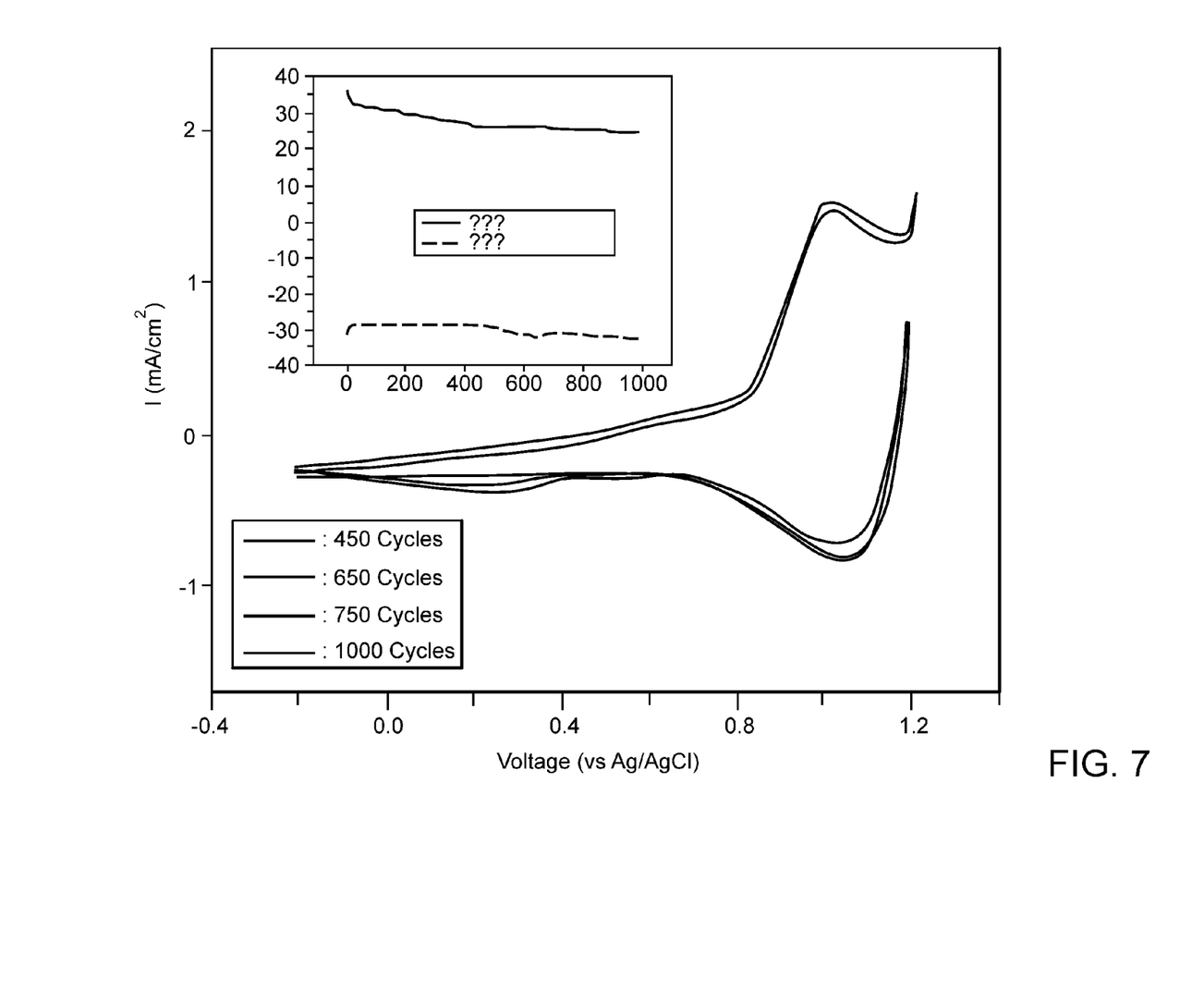
FIG. 7 are cyclic voltammograms of the EQPANSLP peptide-mediated $IrO_2$ nanowires obtained in 0.1M $HClO_4$ by cycling a potential between −0.2V and +1.2V at a scan rate of 20 mV/sec. The inset shows variation of charge densities for both oxidation and reduction and cyclic reversibility with number of cycles.

The integrated anodic current density corresponded to the quantity of protons extracted from the nanowires in order to induce the colored state. The charge extraction density is indicative of the number of active sites in the electrochromic film; the more extracted charge, the better the coloration efficiency of the device. Comparing the net extracted anodic charge between electrodes assembled with two different phage sequences, the fully $IrO_2$ coated AGETQQAM-nanowires exhibited higher charge extraction density, 60 mCcm$^{-2}$ than 40 mCcm$^{-2}$ observed for the partially $IrO_2$ coated EQPANSLP-nanowires (FIG. 4A, inset and FIG. 7). Both of these values are significantly higher than the 16-26 mCcm$^{-2}$ seen in $IrO_2$ electrochromic devices published to date (20). The enhanced charge extraction density is suggestive of faster proton diffusion, which occurs because of the open structural morphology, and numerous active sites due to the large surface area of the virus based film.

Figure 4B:
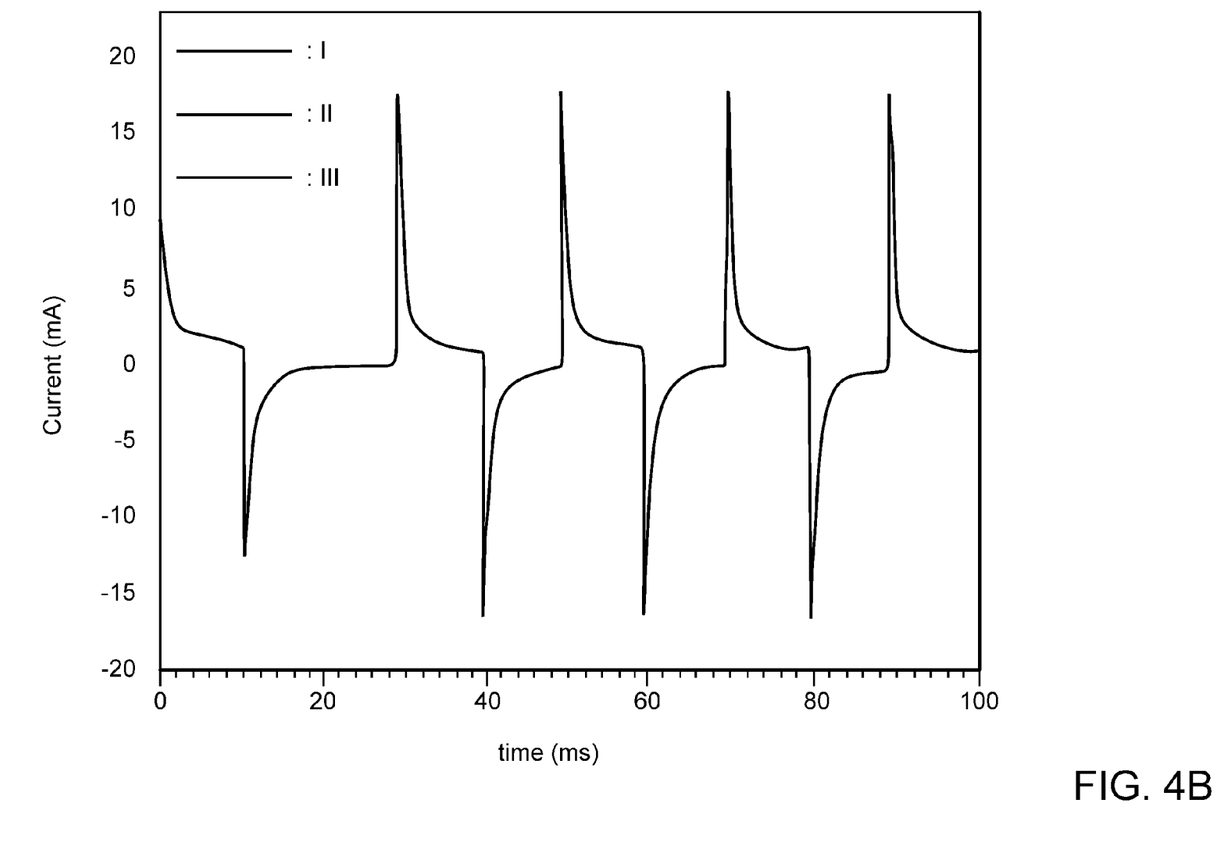
FIG. 4B is a graph of current versus time curves during oxidation and reduction taken after (i) the 500 cycle, (ii) the 1,000 cycle, and (iii) the 1,500 cycle.

Ten-step chronoamperometry was used to measure the kinetics of the electrochromic response of virus-based $IrO_2$ films. Switching time measurements used a programmed 10 steps potential pulse between −0.2V and +1.0V with a pulse width of 20 ms. Both coloring and bleaching state exhibited extremely fast response times of 1 ms, that was repeatedly and consistently obtained (FIG. 4B). Moreover, switching stability showed excellent behavior up to at least 1,500 cycles (FIG. 4B). Iridium oxide films prepared by traditional methods exhibit response times in the range of 40 ms to 5.5 s (6). The charging time of the virus assembled nanowires $IrO_2$ device is also significantly faster than electrochromic devices with different active materials. The response times of $WO_3$:$H_xWO_3$ systems were in the range of 1-5 s (6), while hybrid carbon-nanotube/PEDOT devices in a lithium based electrolyte exhibit response times of less than 10 ms (21).

Figure 4C:
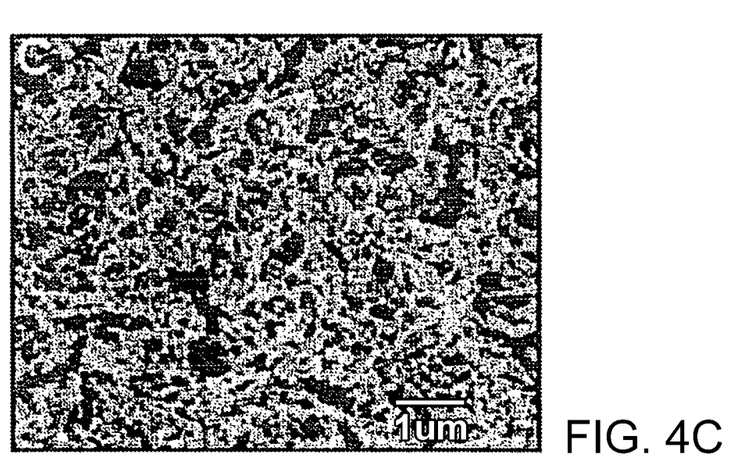
FIG. 4C is a field emission SEM image showing the surface morphology of an as-deposited sample revealing a complex network structure.

The response times for metal oxide electrochromic systems are limited by two factors: fast diffusion pathways and fast space charge migration. The virus-based $IrO_2$ nanowires possess each of these features. Protons can transit along the nanowires surface as well as through internal diffusion pathways, thus leading to a decreased diffusion distance, resulting in a lower charging time. Films with an open morphology (FIG. 4C), as verified by scanning electron microscopy (SEM), provide easy access for protons, further decreasing the response time. Scanning electron microscope (SEM) images were obtained using a JEOL 6320FV. Moreover, if space charge limited migration is the rate-determining step in the charging kinetics, the porous morphology of nanowires films can aid in reducing the response time (22).

Figure 4D:
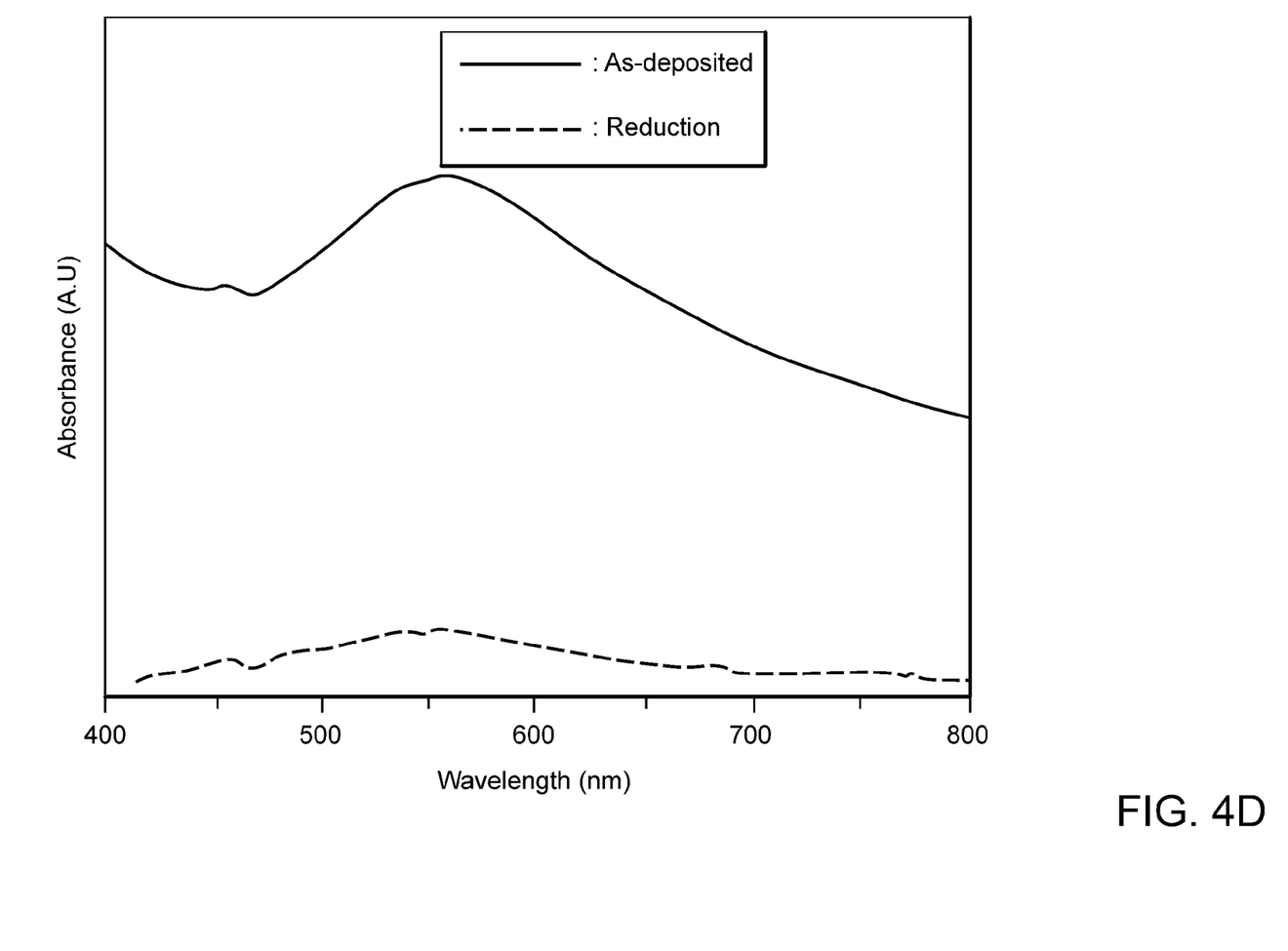
FIG. 4D is a graph showing absorbance spectra of virus-based electrochromic films in the as-deposited state as well as in the bleached state.
Figure 4E:
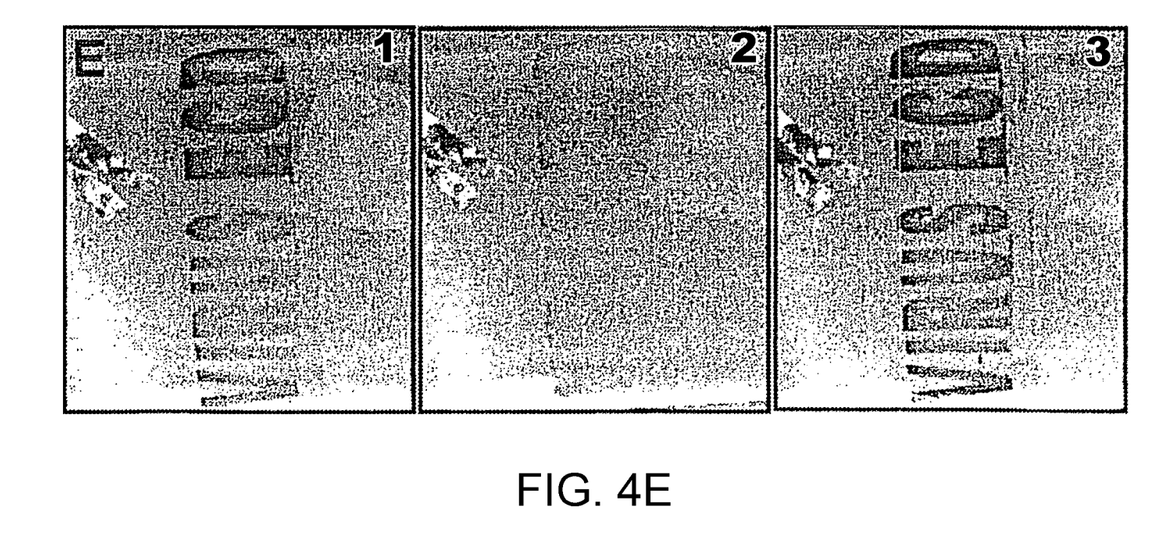
FIG. 4E are images captured from real-time video using patterned virus ECD samples in which 1 is the as-deposited state; 2 is the bleached state, and 3 is the colored state.

The optical properties of the virus-based $IrO_2$ films, both pre-and post-electrical testing, were compared by UV-Vis spectroscopy. Samples were dried and the intensity of the peak was observed near 600 nm, indicative of the $IrO_2$ coloring state. A clear decrease in intensity was noted between the as-deposited samples and the reduced state (bleached). The oxidized (colored) samples showed some increase in intensity compared to the pre-electrical testing samples, but not as dramatic a change as the bleached state (FIGS. 4D and 4E).

These samples were deposited on patterned ITO glass with the words "VIRUS ECD" to enhance color contrast. They demonstrated astonishing of-state color stability, with color retention for more than ten days post electrical testing. For comparison, "ultrafast" $TiO_2$ devices exhibit memory o only 600 s (3).

In this work, we developed a new, rapid, low temperature method that enables inexpensive, bio-directed synthesis of highly crystalline $IrO_2$ nanoparticles. The application of high-voltage electrical pulses enabled the formation of nanoparticles and nanowires from solution at room temperature in less than one minute, without requiring further processing. This approach could potentially be extended to other materials that typically require high temperature synthesis or powerful oxidizing agents, thereby enabling a whole new class of biologically-directed nanocrystalline materials.

Utilizing the biologically-directed $IrO_2$ nanowires, we constructed an electrochromic film with outstanding response time and charge extraction density. The fabrication of this device was simple, low cost, and performed entirely in solution under ambient conditions. These $IrO_2$ films could have further application as electrocatalysts for the electrolysis of water (23) or in biomedical applications (24, 25). Utilizing electrical pulses to stimulate the growth of other types of biologically-directed nanowires provides many opportunities for novel electronic, photoelectronic and energy storage devices.

REFERENCES

1. C.-G. Granqvist, *Nature Materials* 5, 89 (2006).
2. M. Gratzel, *Nature* 409, 575 (2001).
3. D. Cummins et al., *J. Phys. Chem. B* 2000, 11449 (2000).
4. A. A. Argun et al. *Chem. Mater.* 16, 4401 (2004).
5. M. A. El Khakani, M. Chaker, *Thin Solid Films* 335, 6 (1998).
6. G. Gottesfeld, J. D. E. McIntyre, G. Beni, J. L. Shay, *Appl. Phys. Lett.* 33, 208 (1975)
7. A. M. Belcher et al., *Nature* 381, 56 (1991)
8. M. M. Murr, D. E. Morse, *Proc. Nat. Acad. Sci. USA* 102, 11657 (2005).
9. N. C. Seeman, *Nature* 421, 427 (2003).
10. K. Keren, R. S. Berman, E. Buchstab, U. Sivan, E. Braun, *Science* 302, 1380 (2003).
11. K. T. Nam et al., *Science* 312, 885 (2006).
12. C. Mao and D. J. Solis et al., *Science* 303, 213 (2004).
13. C. Mao et al., *Proc. Natl. Acad. Sci. USA* 100, 6946 (2003).
14. S.-K. Lee, D. S. Yun, A. M. Belcher *Biomacromolecules* 7, 14 (2006).
15. V. A. Petrenko, G. P. Smith, X. Gong, T. Quinn, *Protein Engr.* 9, 797 (1996).
16. M. A. El Khakani, M. Chaker, *Thin Solid Films* 335, 6 (1998).
17. H. J. Cho et al., *Jpn. J. Appl. Phys.* 36, 1722 (1997).
18. K. Nishio, Y. Watanabe, T. Tsuchiya, *Thin Solid Films* 350, 96 (1999).
19. F. M. Reames, *Mat. Res. Bull,* 11, 1091 (1976).
20. A. Azens, C. G. Granqvist, *Appl. Phys. Lett.* 81, 928 (2002).
21. S. L. Cho et al., *Adv Mater.* 17, 171 (2005).
22. B. W. Faughnan, R. S. Crandall, M. A. Lampert, *Appl. Phys. Lett.* 27, 275 (1975).
23. T. Ioroi et al., *J. Electrochem. Soc.* 147, 2018 (2000).
24. E. Luksha, "Glucose sensor" U.S. Pat. No. 4, 679,562, 1987.

25. J. D. Weiland, D. J. Anderson, *IEEE Trans. Biomed. Eng.* 47, 911 (2000).

What is claimed is:

1. Method for synthesizing metal oxide nanocrystals comprising:
   forming a precursor solution including the metal oxide cation;
   introducing a selected metal oxide binding virus into the solution; and
   generating electrical pulses across the solution, whereby crystalline nanowires are formed.

2. The method of claim 1 wherein the solution is an aqueous solution.

3. The method of claim 1 wherein the nanocrystal is $IrO_2$.

4. The method of claim 1 wherein the electrical pulses are exponentially decaying pulses.

5. The method of claim 4 wherein the electrical pulses are in the a range of 400V to 1,000V.

* * * * *

UNITED STATES PATENT AND TRADEMARK OFFICE
CERTIFICATE OF CORRECTION

PATENT NO. : 8,535,506 B2  Page 1 of 1
APPLICATION NO. : 12/594253
DATED : September 17, 2013
INVENTOR(S) : Belcher et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1018 days.

Signed and Sealed this
Fifteenth Day of September, 2015

Michelle K. Lee
*Director of the United States Patent and Trademark Office*